US007635910B2

(12) United States Patent
Sinaga et al.

(10) Patent No.: US 7,635,910 B2
(45) Date of Patent: Dec. 22, 2009

(54) SEMICONDUCTOR PACKAGE AND METHOD

(75) Inventors: Richard Mangapul Sinaga, Singapore (SG); Najib Khan Surattee, Singapore (SG); Mohamad Yazid, Sinagpore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/814,433

(22) PCT Filed: Jan. 20, 2005

(86) PCT No.: PCT/IB2005/000143

§ 371 (c)(1),
(2), (4) Date: Feb. 13, 2008

(87) PCT Pub. No.: WO2006/077452

PCT Pub. Date: Jul. 27, 2006

(65) Prior Publication Data

US 2008/0258274 A1    Oct. 23, 2008

(51) Int. Cl.
| H01L 23/495 | (2006.01) |
| H01L 23/28 | (2006.01) |
| H01L 23/48 | (2006.01) |
| H01L 23/31 | (2006.01) |
| H01L 21/00 | (2006.01) |

(52) U.S. Cl. .............. 257/673; 257/E23.046; 257/E23.124; 257/E23.039; 257/E23.051; 257/E21.513; 257/778; 257/796; 257/684; 257/696; 257/737; 257/738; 257/784; 257/786; 257/787; 257/676; 257/666; 257/670; 257/674; 438/123

(58) Field of Classification Search .......... 257/666, 257/696, 698, 690, 670, 671, 674, 669, 673, 257/E23.046, E23.124, E21.513, 778, 796, 257/684, 737, 738, 784, 786, 787, 676, E23.039, 257/E23.051; 438/123
See application file for complete search history.

(56) References Cited

U.S. PATENT DOCUMENTS

| 5,172,214 | A | * | 12/1992 | Casto ........................ 257/676 |
| 5,648,682 | A | | 7/1997 | Nakazawa et al. |
| 6,212,079 | B1 | | 4/2001 | Balakrishnan et al. |
| 6,242,798 | B1 | * | 6/2001 | Cha et al. ................... 257/673 |
| 6,469,398 | B1 | * | 10/2002 | Hori ........................... 257/796 |
| 6,587,357 | B1 | | 7/2003 | Halamik et al. |
| 6,723,585 | B1 | | 4/2004 | Tu et al. |
| 6,876,087 | B2 | * | 4/2005 | Ho et al. ..................... 257/778 |
| 2003/0116833 | A1 | | 6/2003 | Lee et al. |

* cited by examiner

*Primary Examiner*—Alexander O Williams
(74) *Attorney, Agent, or Firm*—Dicke, Billig & Czaja PLLC

(57) ABSTRACT

A semiconductor package is disclosed. In one embodiment, the semiconductor package includes a leadframe including a chip position and a plurality of leadfingers. Each leadfinger includes a cutout in an inner edge providing a chip recess. The semiconductor package further includes a semiconductor chip located in the chip recess. The semiconductor chip has an active surface with a plurality of chip contact pads on each of which an electrically conductive bump is disposed. The inner portions of the leadfingers protrude into the chip position and are electrically connected to the chip contact pads by electrically conductive bumps.

14 Claims, 3 Drawing Sheets

SEMICONDUCTOR PACKAGE AND METHOD

CROSS REFERENCE TO RELATED APPLICATION

This Utility Patent Application claims the benefit of the International Application filing date of PCT Application No. PCT/IB2005/000143, filed January 20, which is herein incorporated by reference.

BACKGROUND

The invention relates to semiconductor packages, the provision of a leadframe and semiconductor packages including the leadframe. The invention also relates to leadless semiconductor packages as well as to methods for producing the leadframe and semiconductor packages.

Existing leadframe-based leaded and leadless packages are known to suffer from various technical problems. The difference in the Coefficient of the Thermal Expansion between the various elements of a typical semiconductor package, such as the semiconductor chip, the leadframe, and the mold compound, and creates warpage and internal stresses within the semiconductor package. This can lead to the formation of cracks and delamination at the interfaces between the different materials. This in turn can lead to failure of the package.

The problem of the difference in thermal expansion coefficients is exacerbated by the large number of interfaces in the package itself. For example, there are interfaces between the semiconductor chip and the mold compound, the semiconductor chip and the glue or die attach material and the glue and the leadframe.

Additionally, heat dissipation from known leadframe-based packages is inefficient, especially for leaded packages, as there is a long path for the dissipation of the heat generated by the semiconductor chip. A further known disadvantage is the antenna effect which is caused by the long electrically conductive path of the package. The electrical path includes the length of the bond wire from the semiconductor chip to the contact pad of the lead of the leadframe and the length of the lead from the inner contact pad to the board on which the package is mounted. The antenna effect is a particular problem for RF application devices.

These problems have been addressed using various approaches. To reduce the mismatch in the Coefficient of Thermal Expansion, the materials used for the package are carefully chosen. Although this approach may reduce the mismatch, the mismatch is not completely eliminated. The costs of the materials used also tend to be higher and this increases the cost of the package.

Thermal dissipation from the package can be improved by providing a package in which the die paddle or die pad is exposed in the outer surface of the package. Alternatively, the use of a die pad is avoided, as is disclosed in U.S. Pat. No. 6,723,585. The problem of the antenna effect has been tackled by controlling the length of the bond wires between the semiconductor chip and the leads of the leadframe. However, the nature of the wire bonding process places a limit on the minimum length of bond wire and a limit on the height of the loop of the bond wire. The improvements possible by this approach are, therefore, limited.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Embodiments of the invention will now be described with reference to the diagrams.

DETAILED DESCRIPTION

Figure 1:
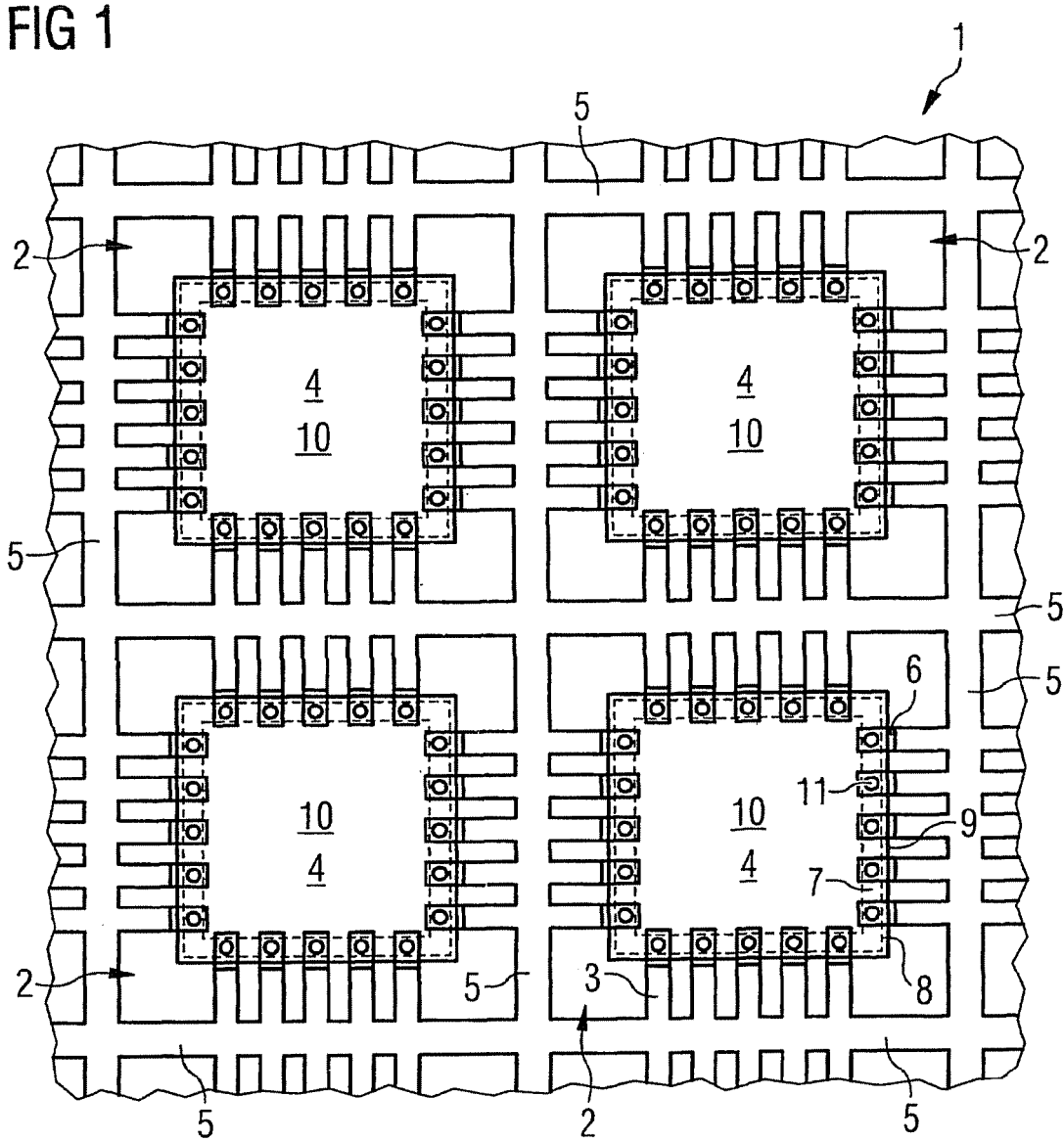
FIG. 1 illustrates a top view of a section of a leadframe strip.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the invention provide a leadframe which avoids the disadvantages of the prior art approaches.

The present invention provides leadframe-based semiconductor packages which can be simply and easily assembled and in which the above disadvantages are avoided.

Embodiments of the present invention provide methods of producing the leadframe and assembly the semiconductor packages.

The invention provides a leadframe for a semiconductor package which includes a chip position and a plurality of leadfingers or leads. Each leadfinger has an inner portion and an outer portion and each leadfinger of the leadframe is essentially the same.

In one embodiment, the chip position is located in approximately the lateral centre of the leadframe and the outer portions of the leadfingers laterally surround the chip position. The inner portions of the leadfingers protrude into the chip position.

Each leadfinger also includes a cutout in an inner edge. The cutout stretches over the breadth of the leadfinger. The cutout provides a leadfinger in which the inner portion has a smaller thickness than the outer portion.

The provision of the cutout in the plurality of leadfingers provides a chip recess to accommodate a semiconductor chip. The chip recess has a base and side walls. The side walls of the cutout provide the side walls of the chip recess. The height of the side wall of the cutout is greater than that of the thickness of the semiconductor chip which is to be mounted in the chip recess. The outer portion of the leadfinger has a thickness which is greater than the thickness of the semiconductor chip.

The spatial arrangement of the leadfingers and the dimensions of the cutout are chosen so as to provide a chip recess which is laterally larger than the chip position. The semiconductor chip is, therefore, able to be accommodated within the chip recess.

The outer portions of the leadfingers laterally surround the chip position. The inner portions of the leadfingers protrude into the area of the chip position and provide at least in part the base of the chip recess.

The leadframe according to the invention, therefore, has a thickness greater than the thickness of the semiconductor chip. This allows the overall height of the package to be reduced as the semiconductor chip is accommodated within the thickness of the leadframe.

Additionally, the inner portion of the leadframe extends into the chip position and is located above the active surface of the chip when the chip is mounted in the chip recess. This reduces the distance between the semiconductor chip and the leads of the leadframe which enables the antenna effect to be reduced.

In one embodiment, the number and lateral arrangement of the leadfingers corresponds to the number and lateral arrangement of the chip contact pads of the semiconductor chip which is to be mounted on the leadframe. One leadfinger is provided for each chip contact pad. The leadframe does not include a die pad. This further reduces the thickness of the final semiconductor package and improves the heat dissipation properties of the package.

In one embodiment, the plurality of leadfingers has a L-shaped longitudinal cross-section. The inner portion of the leadfinger has a smaller thickness than the outer portion. The side walls and the base of the chip recess are essentially mutually perpendicular. Essentially is used in this context to include small variations from a perfect right angle. This provides a chip recess into which a semiconductor chip can be reliably mounted since the distance from the chip to the inner portion of the leadfingers is relatively uniform.

A contact pad is in one embodiment positioned on the inner portion of the leadfinger. The contact pad is located on the surface of the inner portion of the leadfinger which faces the chip recess. The chip contact pad provides at least part of the base of the chip recess. The contact pad in one embodiment, includes a metal or a metal alloy. The metal or metal alloy is chosen so as to improve the electrical connection between the semiconductor chip and the leadfinger.

In one embodiment, the leadframe includes high purity high conductivity copper or a copper alloy, or a nickel-iron alloy. This provides a good electrical conductivity for the leadframe. Copper and copper alloys as well as nickel-iron alloys are relatively inexpensive so that the cost of the package is not increased unnecessarily.

The invention also provides a leadframe strip which includes a plurality of leadframes according to one of the embodiments of the leadframe previously described. The production of a leadframe strip enables the production of many leadframes in the same process step and enables a plurality of packages to be assembled at the same time in a batch or continuous process. This reduces the manufacturing costs and provides a mechanically stable arrangement for the leadframes.

In one embodiment, a leadframe is provided by a single package position within the leadframe strip. Each package position is mechanically connected by tie bars to adjacent leadframes or package positions in the leadframe strip. The tie bars are located between the package positions, i.e. at the periphery of the portion of the package position which provides the leadframe for a package. The tie bars are not included in the leadframe of the package. This arrangement provides a mechanically stable strip. The package can, therefore, be more reliably assembled on the leadframe strip and the failure rate reduced.

The leadframes are in one embodiment, arranged in rows and columns. This simplifies the assembly process of the packages since the automation of the chip placement and formation of the electrical connections between the chip and leadframe is simplified.

The invention also relates to a semiconductor package which includes the leadframe according to one of the embodiments already described. Both the inner portion and outer portion of the leadfingers are in one embodiment, located within the package housing to provide a leadless package.

The semiconductor package also includes a semiconductor chip having an active surface with integrated circuit devices and a plurality of chip contact pads. In one embodiment, the chip contact pads are located towards the peripheral edges of the chip in a single row.

The semiconductor chip also has a passive surface which does not include integrated circuits. A metallization layer is provided on the passive surface. This increases the heat dissipation from the chip and enables the passive surface to be more easily mounted to an external substrate, such as a printed circuit board.

In one embodiment, the number and lateral arrangement of the chip contact pads corresponds to the number and lateral arrangement of the leadfingers of the package position. An electrically conductive bump is disposed on each contact pad on the active surface of the chip.

The semiconductor chip is located in the chip recess of the leadframe and the inner portion of each of the leadfingers is positioned above a chip contact pad. The chip contact pads are electrically connected to the leadfingers by the electrically conductive bumps.

The semiconductor package of the invention, therefore, provides a thinner package as the semiconductor chip is mounted within the thickness of the leadframe. The distance between the chip contact pad and its corresponding leadfinger is reduced in comparison to known leadframe packages which include bond wire connections between the chip contact pads and the leadfingers which are positioned laterally outside the chip.

The provision of the electrically conductive bump on the chip contact pad enables the leadfinger to be electrically connected to the chip contact pad using flip-chip technology. The leadfingers are located above the active surface of the chip and are, therefore, not in mechanical contact with other areas of the active surface. Undesired electrical contact to other elements on the active surface of the chip is, therefore, avoided.

In one embodiment, the electrically conductive bumps include a metal or a metal alloy, and, in one embodiment, include gold or a gold alloy. Gold has a good electrical conductivity and is easily deposited using known ball-bonding and wedge-bonding techniques. The manufacturing process is, therefore, simplified and costs reduced. Alternatively, the electrically conducting bumps include solder. Solder bumps are widely use in semiconductor packages and, therefore, easily used in the package of the invention without significantly increasing the start-up costs.

In one embodiment, the package further includes adhesive means positioned between the electrically conductive bump and the inner portion of the leadfinger. This avoids the use of high temperature soldering or diffusion bonding processes to mechanically attach and electrically connect the leadfinger to the electrically conductive bump. Therefore, the use of high temperatures is can be avoided which reduces the possibility of damage to the devices of the semiconductor chip.

In one embodiment, the adhesive means provides an electrically conductive path between the chip contact pad and the leadfinger. In one embodiment, the leadfingers in the package and chip contact pads are electrically isolated from one another. This arrangement provides the desired electrically conducting path from one chip contact pad to its corresponding lead. At the same time, undesired short circuits between leadfingers and chip contact pads are avoided.

The adhesive means has the form of a ring which is laterally of essentially the same shape as the chip, for example, square. The outer lateral dimensions of the ring are not greater than the lateral size of the chip and, therefore the chip position.

A single ring of adhesive means is positioned between each of the electrically conductive bumps and contact pads in the package. This enables the adhesive means to be provided by a single element in the package and avoids the need to place adhesive between each of the bumps and the leadfingers individually. The assembly process is, therefore, simplified and accelerated.

The adhesive means includes adhesive tape. Adhesive tape has the advantage that it is easily cut to form a ring with the desired size and shape. If the semiconductor chip is laterally square, then a laterally square ring is provided in which the outer side is laterally slightly smaller than the chip. The width of the ring is such that the inner side of the tape lies approximately under the inner side of the inner portion of the leadfinger. Adhesive means is provided in the package only where it is required. Materials costs are, therefore, reduced. An adhesive tape also has the advantage that it is easily applied to the package.

The adhesive tape is anisotropically electrically conductive tape. Such adhesive tape provides an electrically conductive path vertically through the thickness of the tape to provide an electrically conductive path between the electrically conductive bump and the leadfinger but provides no electrically conductive path horizontally in the plane of the tape so that the leadfingers and bumps remain electrically isolated from each other.

An anisotropically electrically conductive tape provides the desired electrical conduction in a form which is simple to produce and simple to apply to the package. Therefore, package assembly costs are further reduced.

In one embodiment, the recess has a depth so that the passive surface of the semiconductor chip and the bottom surface of the outer portion of the leadfingers are essentially coplanar. This is achieved by providing a recess with a depth which is approximately equal to the combined or total thickness of the semiconductor chip, bump and adhesive means.

This arrangement enables the passive surface of the chip and the bottom surface of the outer portion of the leadfingers to provide a part of the outer surface of the semiconductor package Therefore, the package can be reliable mounted to an external substrate, such as a printed circuit board, by these surfaces. This is particularly as the heat dissipation from the chip is improved.

The semiconductor package further includes encapsulation material which encapsulates at least in part the active surface of the semiconductor chip and essentially fills the chip recess. The upper surface of the leadfingers is also covered by a thin layer of the mold material or compound. Upper surface is used in this context to denote the surface which faces away from the chip recess and when the package is mounted on a board faces upwards away from the board.

In one embodiment, the passive surface of the chip, the bottom surface of the outer portion of the leadfingers and the outer side faces of the leadfingers remain free from the mold material and form a common surface with the outer surfaces of the semiconductor package. The bottom surface of the outer portion of the leadfingers provides the outer of external contact areas of the package. This provides a leadless semiconductor package, further reducing the length of the electrical conduction path and the antenna effect.

The encapsulation material, therefore, provides protection from mechanical damage and from the environment for the active surface of the chip and the delicate electrical connections between the chip and leadfingers. However, the outer surfaces of the leadfingers provided on the bottom and side of the package and the passive surface of the chip remain accessible so that the package can be mounted to the board reliably.

The invention also relates to methods to fabricate the leadframe. This is in one embodiment, carried out by fabricating a leadframe strip. Firstly, a metal foil is provided. The metal foil has a thickness which is greater that the thickness of the semiconductor chip which is to be mounted on the leadframe. This enables the chip to be accommodated within a chip recess formed in one side of the leadframe.

A plurality of package positions are then formed in the metal foil to form the leadframe strip. Each package position is in one embodiment, essentially the same. This enables the assembly of a plurality of packages on the leadframe strip in either a batch or continuous process reducing the manufacturing costs.

Adjacent package positions in the leadframe strip are mechanically connected by tie bars. The tie bars form a frame around each package position. This ensures that the package positions in the leadframe strip are mechanically robust and enables the use of automated equipment to assemble the packages on the leadframe strip and to automatically convey the leadframe strip between different stages of the assembly process.

Each package position includes a chip position which in one embodiment is located in approximately the lateral centre of the package position. A plurality of leadfingers are also formed in each package position, each leadfinger having an inner portion and an outer portion. The leadfingers are integral with the tie bars and protrude inwards from the tie bars towards the lateral centre of the package position and, therefore the chip position.

A cutout is then formed in an inner edge of each leadfinger of the package position across the breadth of the leadfinger. The cutouts in each of the leadfingers of the package position create a chip recess for accommodating a semiconductor chip. The chip recess has a base and side walls.

The chip recess is laterally larger than the chip position so that the chip can be laterally accommodated within the chip recess. The outer portions of the leadfingers laterally surround the chip recess and the inner portions of the leadfingers protrude into the chip position and provide at least in part the base of the chip recess.

In one embodiment, the cutout in the leadfingers is formed so that the plurality of leadfingers has a L-shaped longitudinal cross-section. The side walls and the base of the chip recess are, therefore, essentially mutually perpendicular.

An electrically conductive layer is deposited on the inner portion of the leadfingers to form contact pads. The contact pads are disposed on the surface of the inner portion of the leadfinger which faces into the chip recess and, therefore, faces downwards towards the bottom of the package which the package is mounted on a printed circuit board. The contact pads form part of the base of the chip recess.

The package positions and, therefore, the plurality of leadfingers and tie bars are formed in the metal foil by a stamping, a cutting or an etching process to form the leadframe strip. These techniques are well-known in the art and both simple and quick. Therefore, the costs of manufacturing are reduced.

The cutout in each leadfinger and, consequently, the chip recess is in one embodiment formed by a milling or an etching process. These techniques are also well-known and widely used so that the production costs of the leadframe strip are not greatly increased by the provision of the chip recess.

The contact pad is in one embodiment, deposited by a vacuum deposition process or an electro-deposition process and in one embodiment includes a metal or a metal alloy. The contact pad may also includes two or more layers of different metals. These methods are widely used for the deposition of metal contact pads.

As, in the leadframe strip of the invention, the contact pads are located on the base of the recess, electro-deposition is used as electro-deposition techniques have the advantage that the quality of the coating deposited is not greatly adversely affected by the shape of the substrate, in this case the leadframe strip. Therefore, a high quality contact pad can be deposited at the base of the recess simply and quickly.

The invention also relates to methods to assemble semiconductor packages. Firstly, a leadframe strip according to one of the embodiments previously described is provided.

A semiconductor chip having an active surface with integrated circuit devices and a passive surface is provided. The semiconductor chip also has a plurality of chip contact pads located on its active surface in one embodiment arranged in a single row towards the peripheral edges or regions of the active surface. In one embodiment, the number and lateral arrangement of the chip contact pads corresponds to the number and lateral arrangement of the leadfingers of the package position or leadframe. An electrically conductive bump is then formed on each chip contact pad.

The semiconductor chip is then mounted in the chip recess in a package position of the leadframe strip. The chip is mounted so that an inner portion of the leadfingers is positioned above a corresponding chip contact pad. The active surface of the chip, therefore, faces the inner portion of the leadfingers.

The chip contact pads are then electrically connected to their corresponding leadfingers via the electrically conductive bumps.

In one embodiment, the method of assembling a semiconductor package includes the further process of positioning an adhesive means between the electrically conductive bump and the inner portion of the leadfinger. The use of an adhesive means to attach the chip to the leadframe has the advantage that the use of a solder or diffusion bonding process can be avoided. This reduces possible damage to the devices of the semiconductor chip used by the high temperatures required in typical solder reflow and diffusion bonding processes.

The adhesive means may be attached to the electrically conductive bumps positioned on the semiconductor chip. This method has the advantage that the adhesive means can be more accurately placed on the bumps.

Alternatively, the adhesive means may be placed on the inner portions of the leadfingers on the surface which faces the chip recess and forms a part of the base of the chip recess. This method has the advantage that the adhesive means is attached to a relatively flat surface. Also, more pressure can be applied when attaching the adhesive means to the leadfingers which improves the connection.

The adhesive means in one embodiment provides an electrically conductive path between the chip contact pad and the inner portion of the leadfinger. This enables the integrated circuit devices in the chip to be accessed via the leadfinger from outside of the package. However, the leadfingers of the package position are electrically isolated from one another by use of the adhesive means. This eliminates undesired short circuits between the leadfingers and, therefore, chip contact pads.

The adhesive means is applied in the form of a single ring which is positioned between each of the electrically conductive bumps and inner portion of the leadfingers in each package position. This is as the adhesive means for all of the leadfingers in the package is applied in the same process step and is provided by a single element.

In one embodiment, the adhesive means includes adhesive tape. An adhesive tape can be easily cut to form the desired shape and is easily applied to either the leadfingers or bumps.

The adhesive tape is an anisotropically electrically conductive tape. The anisotropically electrically conductive tape provides an electrically conductive path through the thickness of the tape but no electrically conductive path horizontally, i.e. in the plane of the tape. The anisotropically electrically conductive tape then provides the electrical contact from the chip contact pad to the leadfingers but the leadfingers remain electrically isolated from each other. This has the advantage that a single tape which can be applied to all of the contacts or leadfingers in a single simple process provides the desired electrically conductive pathways.

In one embodiment, the semiconductor chip is mounted in the chip recess so that the passive surface of the chip and the bottom surface of the outer portion of the leadfinger are essentially coplanar. The semiconductor chip is, therefore, accommodated within the volume of the recess. It is that the passive surface of the chip and the bottom surface of the outer portion of the leadfingers are essentially coplanar as these surfaces are then able to reliably form parts of the outer bottom surface of the package. A leadless package is, therefore, provided. The package can be reliably mounted on an external substrate such as a printed circuit board.

In one embodiment, the electrically conductive bumps are formed on the chip contact pads by a ball-bonding or a wedge bonding technique. These techniques are well-known and can be automatically carried out. This reduces the costs of producing the chip including the bumps.

A method to assemble the package in one embodiment includes the following further processes. After a semiconductor chip has been mounted and electrically connected in each of the package position in the leadframe strip, each package position is encapsulated or over-molded.

The active surface of the chip, the chip recess and upper surface of the leadfingers are encapsulated by mold material. Suitable encapsulation or mold materials are known in the art. The passive surface of the chip, the bottom surface of the outer portion of the leadfingers and the outer side faces of the leadfingers remain free of the mold material. These surfaces provide at least part of the outer surfaces of the semiconductor package.

Each package position may be encapsulated suing known techniques such as molding or a globe-top technique.

Finally, the individual packages are separated from the leadframe strip by removing the tie bars. The packages are separated so that outer side faces of the outer portions of the leadfingers are approximately coplanar with the side faces of the mold or encapsulation material. This forms the side faces of the semiconductor package and a leadless semiconductor package is provided.

The package positions are in one embodiment separated from the leadframe strip by a stamping or a cutting technique. These techniques are also widely used so that production costs are not greatly increased.

The packages may be separated by cutting or stamping through the mold material and tie bars or the extreme outer portions of the leadfingers. Alternatively, a molding technique may be used in which the outer dimensions of the encapsulation are more closely determined. In this case, only the metal of the leadfingers and/or tie bars is cut.

To summarise, the package and leadframe of the invention does not include a die paddle or die pad. This reduces the number of interfaces within the package and, therefore, reduces interfacial stresses in the package caused by the different thermal expansion coefficients of the materials.

Since the passive or backside of the semiconductor chip is exposed from the package, the thermal dissipation path is shortened and heat can be dissipated more efficiently. The package can be mounted directly to a board and the heat generated by the chip can be dissipated directly from the chip to the board.

The use of leadfingers which extend into the chip position of the leadframe and are connected to the semiconductor chip by electrically conducting bumps shortens the electrical path. This in turn reduces the antenna effect which is particularly for RF devices.

A further advantage of the leadframe and package of the invention, is that a package with a very thin profile is provided. The package can have a thickness of less than around 0.5 mm. This is achieved since the chip is mounted within a recess of the leadframe itself. The chip is, therefore, mounted within the thickness of the leadframe.

Furthermore, the chip is mounted to the leadframe by flip-chip technology, such as electrically conductive bumps or by metal bumps and an adhesive. Since bond wires are not used for the electrical connections, the height required by the loop of the bond wire must no longer be accommodated in the thickness of the package. Therefore, the height or profile of the package is reduced through the use of a flip-chip technique.

FIG. 1 illustrates a top view of a section of a leadframe strip 1 which includes a plurality of package positions 2. Four package positions 2 are illustrated in the section illustrated in FIG. 1. Each package position 2 is essentially the same and is essentially laterally square. The package positions 2 are arranged in rows and columns in the leadframe strip 1 and have a square grid arrangement.

Each package position 2 includes a plurality of leadfingers 3 which laterally surround a chip position 4. The chip position 4 is located in approximately the lateral centre of the package position 2. Each package position 2 is physically connected to its adjacent neighbours by tie bars 5 which have a square grid arrangement.

The leadfingers 3 protrude inwardly from the tie bars 5 towards the centre of each package position 2. In the example illustrated in FIG. 1, each of the four sides of each package position 2 include five leadfingers 3 positioned in approximately the lateral centre of each side. The leadfingers 3 are approximately equally spaced from each other.

The inner portion of each leadfinger 3 includes a contact pad 6. The contact pad 6 typically includes a layer of an appropriate metal in order to improve the bonding between the leadfinger 3 and the material of the contacting means which electrically connects the semiconductor chip, which will be mounted in the chip position 4, to the leadfinger 3.

The leadframe strip 1 is used in the assembly of semiconductor packages. FIG. 1, therefore, also indicates, in each of the package positions 2 of the leadframe strip 1, the lateral position of the further elements which make up the semiconductor package of the invention.

An adhesive tape 7 is provided which has the form of an essentially square annular ring. The position of the adhesive tape 7 is indicated by the two concentric dotted lines 8. The adhesive tape is positioned on the contact pads 6. The tape including the ring has a width which is slightly less than that of the contact pads 6.

The position of the chip position 4 in each package position 2 is indicated by the solid line 9. The chip position 4 is essentially the same lateral size as the semiconductor chip 10 which is to be mounted in the package. The chip position 4 is laterally larger than the distance between opposing leadfingers 3 of each package position 2. Therefore, at least part of the inner portion of the leadfingers 3 which includes the contact pad 6 lies within the area of the chip position 4.

The semiconductor chip 10 is positioned in essentially the lateral centre of each package position 2. The edge of the chip position 4, as indicated by the solid line 9, and, therefore, the side faces of the semiconductor chip 10 are laterally positioned slightly inside the interface between the contact pads 6 and outer portion of the leadfingers 3.

FIG. 1 also illustrates the position of the contacting means between the semiconductor chip 10 and the leadfingers 3 which, according to the invention, include electrically conducting gold bumps 11. A gold bump 11 is positioned on the contact pad 6 of each of the leadfingers 3.

After a plurality of packages have been assembled on the leadframe strip 1, one package 12 in each package position 2, the tie bars 5 are removed, typically by a cutting or stamping process, to separate the packages 12 from the leadframe strip 1. The tie bars 5 are, therefore, not included in the semiconductor package and are not visible in FIG. 2 which illustrates the semiconductor package 12.

Figure 2:
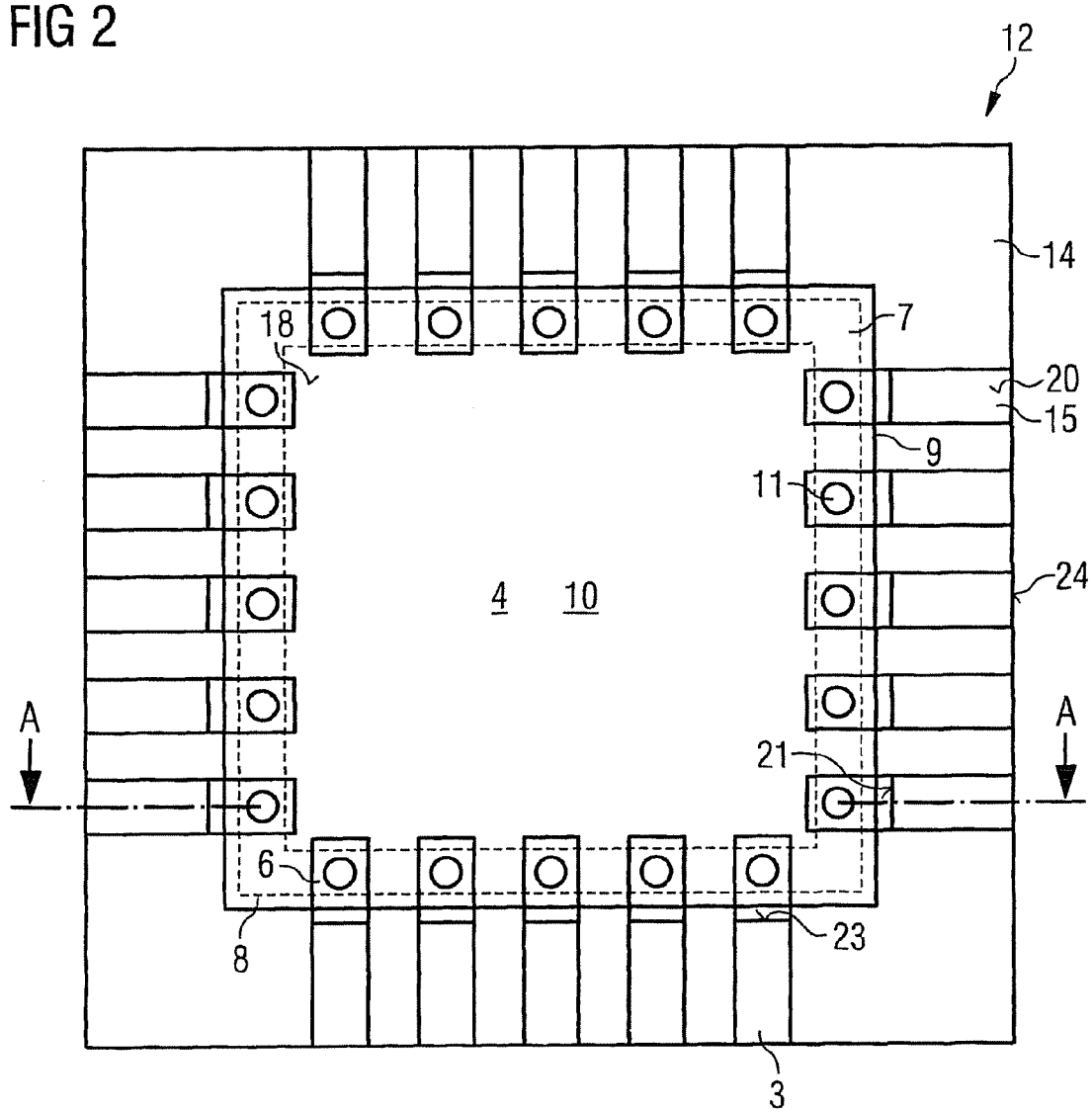
FIG. 2 illustrates a bottom view of a semiconductor package including a leadframe of the leadframe strip of FIG. 1.

FIG. 2 illustrates a bottom view of a semiconductor package 12 assembled using the leadframe strip 1 of FIG. 1. The package 12, therefore, includes the leadfingers 3 of a single package position 2 of the leadframe strip 1. The tie bars 5 have been removed.

Parts of the semiconductor package 12 which are essentially the same as that described in FIG. 1 are denoted by the same reference number and are not necessarily described again.

The semiconductor package 12 includes a semiconductor chip 10 located in the chip position 4. The chip position 4 and semiconductor chip 10 are located in the approximate lateral centre of the package 12. The semiconductor chip 10 is laterally surrounded by a plurality of leadfingers 3. In this embodiment, each of the four sides of the semiconductor chip 10 include five leadfingers 3. The inner portions 13 of the leadfingers 3, which include the contact pad 6, protrude into the chip position 4, as is indicated by the dotted lines. The inner portions 13 of the leadfingers 3 are located above the active surface of the semiconductor chip 10.

A ring of adhesive tape 7, which has an essentially square lateral cross-section, is positioned on the contact pads 6 of each of the leadfingers 3. The ring of adhesive tape 7 is, therefore, laterally smaller than the semiconductor chip 10 and is also located within the area of the chip position 4. The semiconductor chip 10 is electrically connected to the adhesive tape 7 and contact pads 6 of the leadfingers 3 by gold bumps 11. A gold bump 11 is located on each of the contact pads 6 on the inner portion 13 of the leadfingers 13. This arrangement is described in more detail with reference to FIG. 3.

The semiconductor chip 10 and leadfingers 3 are embedded in a mold material 14 to form the semiconductor package 12. The lower surface 20 of the outer portions 15 of the leadfingers 3 is coplanar with the bottom surface 23 of the mold material 14. The lower surface 20 of the outer portion 15 of the leadfingers 3 provides the external contact areas of the package 12. The relative positions of the leadfingers 3 and the semiconductor chip 10 are seen more clearly in FIG. 3.

Figure 3:
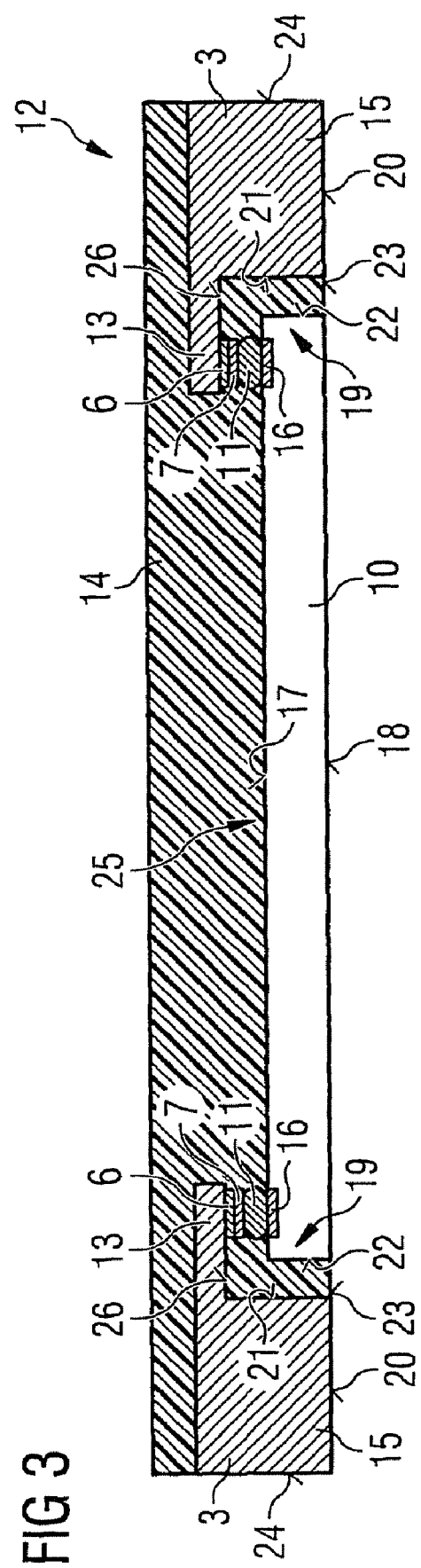
FIG. 3 illustrates a cross-sectional view along the line A-A of the semiconductor package of FIG. 2.

FIG. 3 depicts the semiconductor package 12 in the cross-sectional view along the line A-A indicated in FIG. 2.

The semiconductor package 12 includes a semiconductor chip 10 located in approximately the lateral centre of the package 12. The semiconductor chip 10 includes a plurality of chip contact pads 16 located on its upper surface towards the periphery of the upper surface. The upper surface including the chip contact pads 16 is, therefore, the active surface 17 of the semiconductor chip 10 and the opposing surface is, therefore, the passive surface 18 of the semiconductor chip 10. The chip contact pads 16 are arranged in a single row in the peripheral region of each edge of the active surface 17.

The number and lateral arrangement of the chip contact pads 16 corresponds to the number and lateral arrangement of the leadfingers 3 of the package 12. Therefore, in this embodiment, the chip 10 includes five chip contact pads 16 arranged along each of the four sides of the chip 10.

A gold bump 11 is positioned on each of the chip contact pads 16. An adhesive tape 7, which in this embodiment of the invention includes an electrically anisotropic conducting adhesive tape, is positioned on each of the gold bumps 11. Two of a plurality of leadfingers 3 can be seen in this cross-sectional view. The inner portion 13 of each leadfingers 3 is located above a chip contact pad 16 on the active surface 17 of the semiconductor chip 10.

Each of the leadfingers 3 has an outer portion 15 which is thicker than the inner portion 13 which is located above the semiconductor chip. The upper surface of the outer portion 15 and the upper surface of the inner portion 13 of the leadfinger 3 are essentially coplanar. Each leadfinger 3, therefore, includes a cutout 19 positioned in the inwardly facing edge of its bottom surface 20. The cutout 19 extends over the breadth of the leadfinger 3. Each leadfinger 3, therefore, has a L-shaped longitudinal cross-section.

The bottom surface 20 of the outer portion 15 of the leadfinger 3 provides an outer or external contact area of the semiconductor package 12 and lies in essentially the same plane as the outer bottom surface of the package 12 and the passive surface 18 of the semiconductor chip 10. The semiconductor package 12 is, therefore, a leadless package.

The inner portion 13 of the leadfingers 3 is positioned above the active surface 17 of the semiconductor chip 10 and is attached to the adhesive tape 7. The contact pad 6 is positioned on the underside surface of the protruding inner portion 13 of the leadfingers 3. Each leadfinger 3 is, therefore, electrically connected to a chip contact pad 16 by the adhesive tape 7 and by a gold bump 11.

The cutout 19 located in each leadfinger 3 has a height which is essentially the same as the combined or total height of the semiconductor chip 10, gold bump 11 and adhesive tape 7. The cutout 19 has a width so that the semiconductor chip 10 fits within the inner vertical walls 21 of the outer portion 15 of two opposing leadfingers 3 of a package position 2.

The inner vertical walls 21 of the leadfingers 3 and protruding inner portion 13 of the leadfingers provide a recess 25 in the approximate lateral centre of each package position 2. The chip recess 25 has side walls 21 and a base 26. The chip recess 25 is laterally larger than the chip position 4 and, therefore, the semiconductor chip 10. The inner portion 13 of leadfingers 3 which protrudes into the chip position 4 provides the base 26 of the chip recess 25. The contact pads 6, therefore, provide at least part of the base 26 of the chip recess 25.

The chip recess 25 is, therefore, laterally larger than the semiconductor chip 10 and has a depth which is greater than the thickness of the chip 10. The depth of the recess 25 is, therefore, approximately the same as the thickness of the semiconductor chip 10, gold bump 11 and adhesive tape 7. The thickness of the outer portion 15 of the leadfinger 3 is therefore, greater than the thickness of the semiconductor chip 10. The semiconductor chip is, therefore, accommodated within the chip recess 25 provided in the leadframe.

The semiconductor package 12 also includes an encapsulation or mold material 14 which covers the upper surface of the leadfingers 3 and which essentially fills the space formed between the leadfingers 3, the side faces 22 of the semiconductor chip 10 and the inner side walls 21 of the outer portion 15 of the leadfingers 3. The bottom surface 20 of the leadfingers 3, the bottom surface 23 of the mold material 14 and the passive surface 18 of the semiconductor chip 10 are essentially coplanar and provide the outer bottom surface of the semiconductor package 12. The leadframe and, therefore, the semiconductor package 12 does not include a die pad.

The bottom surface 20 of the leadfingers 3 is, therefore, exposed from the semiconductor package 12. The outer side faces 24 of the leadfingers 3 and the passive surface 18 of the semiconductor chip 10 also remain free from the mold material 14 and are exposed from the semiconductor package 12. The outer side faces 24 of the leadfingers lie in essentially the same plane as the outer side faces of the semiconductor package 12.

The adhesive tape 7 is electrically anisotropic and provides an electrically conducting path vertically between the chip contact pads 16 of the semiconductor chip 10 and the individual leadfingers 3. However, the adhesive tape 7 provides no electrically conductive path in a horizontal direction, i.e. in the plane of the tape. Therefore, the leadfingers 3 remain electrically isolated from each other even though the adhesive tape 7 is physically in connection with all of the leadfingers 3 of the semiconductor package 12.

An anisotropically electrically conductive tape is particularly as the adhesive tape 7 is able to provide mechanical support for the leadfingers 3 of each package position 2 but does not electrically connect the plurality of leadfingers 3 of the semiconductor package 12. The chip contact pads 16, therefore, also remain electrically isolated from each other.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor package comprising:
a leadframe including a chip position, and a plurality of lead fingers, each leadfinger having an inner portion and an outer portion;
wherein each leadfinger includes a cutout in an inner edge providing a chip recess to accommodate a semiconductor chip, the chip recess having a base and side walls;

wherein the chip recess is laterally larger than the chip position, wherein the inner portions of the leadfingers protrude into the chip position and provide at least in part the base of the chip recess an adhesive disposed in the form of a continuous ring about a perimeter of the chip recess and on at least a portion of the inner portion of each leadfinger, wherein the adhesive on the inner portion of each leadfinger is configured to bond to a corresponding electrically conductive bump on the semiconductor chip.

2. The package of claim 1 comprising:
wherein the plurality of leadfingers has an L-shaped longitudinal cross-section, and the side walls and the base of the chip recess are essentially mutually perpendicular.

3. The package of claim 1 comprising:
wherein a contact pad is positioned on the inner portion of the leadfinger and provides at least part of the base of the recess.

4. The package of claim 1 comprising:
wherein the leadframe comprises copper or a copper alloy, or a nickel-iron alloy.

5. The package of claim 1 comprising:
one or more additional leadframes defining a leadframe strip.

6. The package of claim 5 comprising:
wherein each leadframe is mechanically connected by tie bars to adjacent leadframes in the leadframe strip and the leadframes are arranged in rows and columns.

7. A semiconductor package comprising:
a leadframe including a chip position, and a plurality of leadfingers, each leadfinger having an inner portion and an outer portion;
wherein each leadfinger includes a cutout in an inner edge providing a chip recess to accommodate a semiconductor chip, the chip recess having a base and side walls; and
wherein the chip recess is laterally larger than the chip position, wherein the inner portions of the leadfingers protrude into the chip position and provide at least in part the base of the chip recess;
an adhesive disposed on at least a portion of the inner portion of each leadfinger;
a semiconductor chip having an active surface with a plurality of chip contact pads and a passive surface;
an electrically conductive bump disposed on each contact pad; and
wherein the semiconductor chip is located in the chip recess, the inner portions of the leadfingers are positioned above the chip contact pads, and wherein the chip contact pads are electrically connected to the leadfingers via the electrically conductive bumps and the adhesive.

8. The semiconductor package of claim 7 comprising:
wherein the electrically conductive bumps comprise gold or a gold alloy or solder.

9. The semiconductor package of claim 7, comprising wherein the adhesive provides an electrically conductive path between the chip contact pad and the leadfinger, the leadfingers being electrically isolated from one another.

10. The semiconductor package of claim 7, comprising wherein the adhesive has the form of a ring which is positioned between each of the electrically conductive bumps and the leadfingers in the package.

11. The semiconductor package of claim 7, comprising wherein the adhesive comprises adhesive tape.

12. The semiconductor package of claim 11 comprising wherein the adhesive tape is an anisotropically electrically conductive tape.

13. The semiconductor package of claim 11, comprising wherein the passive surface of the semiconductor chip and the bottom surface of the outer portion of the leadfingers are essentially coplanar.

14. The semiconductor package of claim 7 comprising:
wherein the package further includes encapsulation material which encapsulates at least in part the active surface of the semiconductor chip, the chip recess and upper surface of the leadfingers, and wherein the passive surface of the chip, the bottom surface of the outer portion of the leadfingers and the outer side faces of the leadfingers provide at least part of the outer surfaces of the semiconductor package.

* * * * *